United States Patent [19]

Ayukawa et al.

[11] Patent Number: 5,348,900

[45] Date of Patent: Sep. 20, 1994

[54] PROCESS FOR MANUFACTURING A SEMICONDUCTOR DEVICE INCLUDING HEAT TREATMENT IN AMMONIA OR OXYGEN

[75] Inventors: Akitsu Ayukawa; Shigeo Onishi, both of Nara, Japan

[73] Assignee: Sharp Kabushiki Kaisha, Osaka, Japan

[21] Appl. No.: 932,943

[22] Filed: Aug. 21, 1992

[30] Foreign Application Priority Data

Oct. 11, 1991 [JP] Japan ............................. 3-264020
Nov. 1, 1991 [JP] Japan ............................. 3-287804

[51] Int. Cl.⁵ ..................................... H01L 21/336
[52] U.S. Cl. ..................................... 437/44; 437/41; 437/29; 437/238; 437/247
[58] Field of Search ............... 437/41, 44, 29, 247, 437/238

[56] References Cited

U.S. PATENT DOCUMENTS

| | | | |
|---|---|---|---|
| 4,329,773 | 5/1982 | Geipel, Jr. et al. | 437/45 |
| 4,525,378 | 6/1985 | Schwabe et al. | 437/29 |
| 4,786,609 | 11/1988 | Chen | 437/30 |
| 5,130,266 | 7/1992 | Huang et al. | 437/44 |
| 5,166,087 | 11/1992 | Kakimoto et al. | 437/44 |

FOREIGN PATENT DOCUMENTS 2-138748  5/1990  Japan .

*Primary Examiner*—T. N. Quach
*Attorney, Agent, or Firm*—Nixon & Vanderhye

[57] ABSTRACT

A process for manufacturing a semiconductor device, including the steps of: forming a oxide film over the entire surface of a semiconductor substrate formed with a gate electrode having side walls on opposite sides thereof with intervention of a gate oxide film, followed by implanting an impurity into a predetermined region; subjecting the substrate to a first heat treatment; removing the oxide film existing in the predetermined region; and subjecting the substrate to a second heat treatment in an ammonia or oxygen gas atmosphere.

7 Claims, 2 Drawing Sheets

PROCESS FOR MANUFACTURING A SEMICONDUCTOR DEVICE INCLUDING HEAT TREATMENT IN AMMONIA OR OXYGEN

FIELD OF THE INVENTION

This invention relates to a process for manufacturing semiconductor devices, and more particularly to MOS devices having a LDD (Lightly Doped Drain) structure.

DESCRIPTION OF THE PRIOR ART

Described below with reference to FIG. 2 is a conventional process for manufacturing a MOS memory cell having a LDD structure.

A device isolation region is first formed by growing a field oxide on a p-type silicon substrate 10 to define a device formation region. After covering the device formation region with a gate oxide film 2, a gate electrode 3 is formed by depositing a polysilicon to 3500–4000 Å thick on the substrate. In turn phosphorus- or arsenic ions are implanted with use of the gate electrode as a mask to form a lightly-doped source/drain region 8a. Thereafter, a $SiO_2$ film is deposited to 2500–3500 Å thick by CVD process and etched back by reactive ion etching (RIE) and HF wet etching to form side walls 4 of $SiO_2$ on opposite sides of the gate electrode 3 with a $SiO_2$ film 6 of about 100–400 Å thick retained on the substrate 10.

In turn ions of a n-type impurity such as As or the like are implanted into a source/drain formation region through the $SiO_2$ film 6 with use of the gate electrode 3 as a mask to form a source/drain region 8, as shown in FIG. 2(a). The substrate thus treated is then subjected to heat treatment at an intermediate temperature, for example, 800° C. for about an hour to diffuse the implanted ions. Thereafter, a NSG film 11 is deposited on the $SiO_2$ film 6, followed by deposition of a BPSG film 12 to planarize the substrate surface, as shown in FIG. 2(b). Then, the substrate is subjected to a further heat treatment at a high temperature, for example, at 950° C. for about half an hour to recover the crystallinity of the source/drain region 8.

The presence of crystalline defects in the source/drain region is mentioned as one of the causes a microminiaturized MOS transistor. In the above prior art method, the ion implantation through the $SiO_2$ film 6 causes oxygen atoms therein to recoil and thereby to be implanted into the substrate 10 together with the impurity ions. The implanted oxygen atoms cause crystalline defects 7 to occur in the substrate 10, as shown in FIG. 2(b). These defects 7 cannot be completely eliminated by the post-heat treatment, and accordingly they cause leakage current, leading to decrease in yield. In addition the high-temperature heat treatment conducted after the ion implantation enlarges the junction depth (Xj), resulting in disadvantage to microminiaturization.

SUMMARY OF THE INVENTION

The present invention provides a process for manufacturing a semiconductor device comprising the steps of:

forming an oxide film over the entire surface of a semiconductor substrate formed with a gate electrode having side walls on opposite sides thereof with intervention of a gate oxide film, followed by implanting an impurity into a predetermined region;

subjecting the substrate to a first heat treatment;

removing the oxide film existing in the predetermined region; and subjecting the substrate to a second heat treatment in an atmosphere containing ammonia gas or oxygen gas.

According to the present method, crystalline defects in the substrate can be substantially avoided and a production yield can be assured.

DETAILED DESCRIPTION OF THE PREFERRED EMBODIMENTS

Figure 1A:
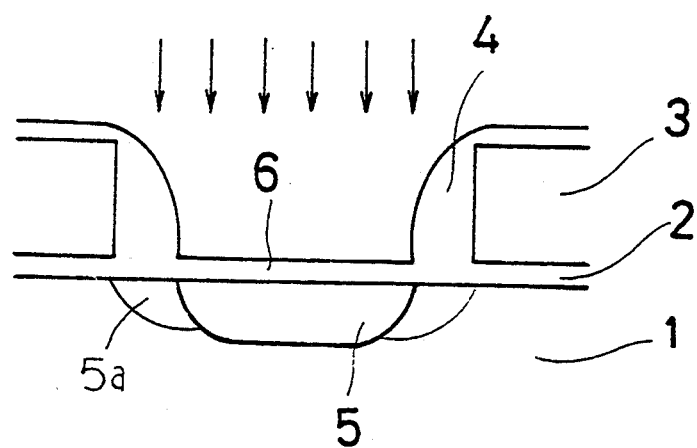
FIGS. 1(a) and 1(b) are schematic sectional views illustrating a process for manufacturing a semiconductor device, embodying the present invention.
Figure 1B:
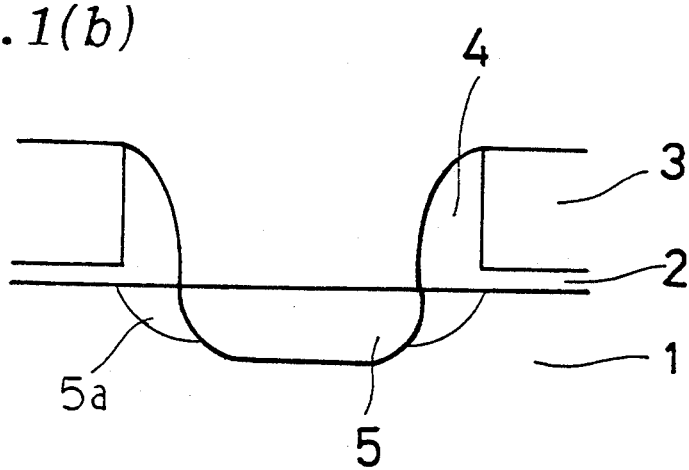
Figure 2A:
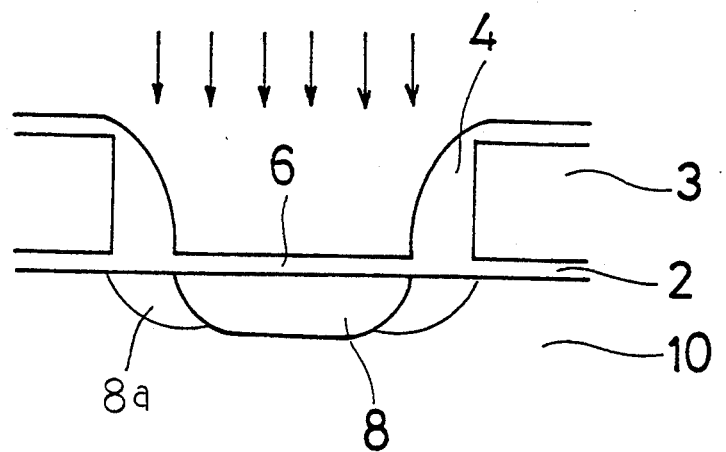
FIGS. 2(a) and 2(b) are schematic sectional views illustrating a conventional process for manufacturing a semiconductor device.
Figure 2B:
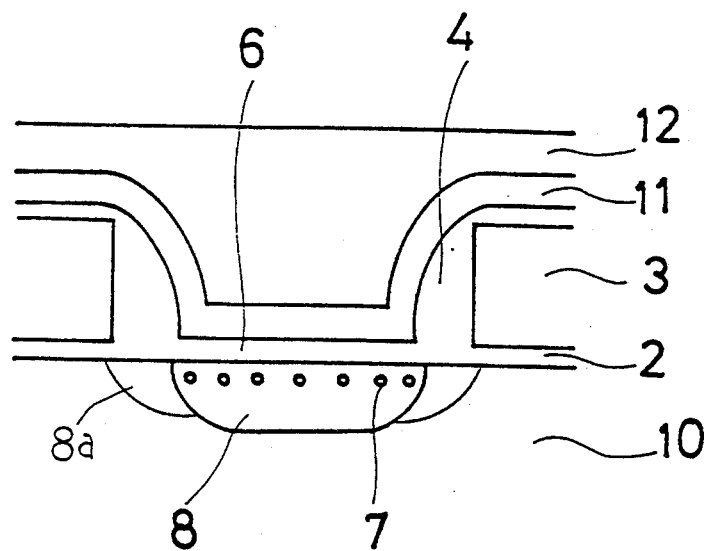

A semiconductor substrate as used in the invention is preferably of silicon including p-type impurity or n-type impurity, but not particularly limited. The semiconductor substrate is formed thereon with a gate oxide film such as of $SiO_2$ having a thickness of about 50–200 Å by a well-known technique, for example thermal oxidation or CVD method. On the gate oxide film, formed by a known technique such as CVD method using $Si_2H_6$ is a gate electrode such as of polysilicon having a thickness of about 3500–4000 Å. The $SiO_2$ film is formed to about 100–400 Å over the entire surface of the semiconductor substrate including the gate electrode. Thereafter, ions of an impurity different in conductivity type from the substrate are implanted through the $SiO_2$ film in a dose of $1\times10^{15}$ to $1\times10^{17}$ ions/cm$^2$ at 40–80 keV with use of the gate electrode as a mask into predetermined region to form a source/drain region. Examples of the impurity includes boron and the like as p-type impurity and phosphorus, arsenic and the like as n-type impurity.

The semiconductor device may be having the LDD structure. In the case where a source-drain region is to be formed by the gate electrode having the LDD structure, ions of an impurity different in conductivity type from the substrate may be implanted into a predetermined region of the substrate in a low dose, for example, about $1\times10^{13}$ to about $1\times10^{14}$ ions/cm$^2$ at an acceleration energy of about 20 to about 40 keV to form a lightly doped source/drain region previously. In turn a $SiO_2$ film of a high-temperature oxide may be deposited to about 2500–3500 Å thick over the substrate surface to cover the gate electrode by a known technique such as LPCVD method and etched back by a reactive ion etching (RIE) to form side walls on opposite sides of the gate electrode, while forming the $SiO_2$ film by retaining to about 100–400 Å thick over the entire surface of the semiconductor substrate. In this case a HF treatment may be carried out following the reactive ion etching.

The substrate thus treated undergoes a first heat treatment at about 750°–850° C. for 30–60 minutes.

The $SiO_2$ film existing in the predetermined region is then removed by a known etching technique such as RIE.

Thereafter, a second heat treatment is carried out in an ammonia or oxygen gas atmosphere. In the case of using an ammonia gas atmosphere, it is preferable to conduct the second heat treatment at 1000°–1100° C. for 10–60 sec with a Rapid Thermal Annealer (RTA) in an atmosphere into which ammonia gas is introduced at a flow rate of about 3–6 liter/min. On the other hand, if an oxygen gas is used, it is preferable to conduct the second heat treatment at about 800°–900° C. for 10–30 minutes in an atmosphere to which oxygen gas is introduced at a flow rate of about 30–40 liter/min. The RTA can also be used for this heat treatment and in that case the heat treatment is conducted preferably at about 800°–900° C. for 10–60 sec.

The above process enables to eliminate crystalline defects such as extrinsic-type stacking faults and the like that are produced in the semiconductor substrate upon ion implantation through the SiO$_2$ film. More specifically, the second heat treatment in an ammonia or oxygen gas atmosphere at a high temperature causes Si atoms to spring out of the semiconductor substrate, with the result that vacancies are forcedly introduced in the substrate. Consequently, these holes serve to rectify the existing defects in the substrate, leading to an impurity diffusion region free from defects.

The present invention will be more fully described with reference to Examples shown in the drawings.

EXAMPLE 1

A device formation region on a p-type silicon substrate 1 is covered with a gate oxide film 2 of about 100 Å thick, and thereon a gate electrode 3 is formed by depositing a polysilicon to 3500–4000 Å thick. In turn phosphorus ions are implanted in a dose of $1 \times 10^{13}$ ions/cm$^2$ at 40 keV with use of the gate electrode as a mask to form a lightly-doped source/drain region 5a. Thereafter, a SiO$_2$ film is deposited to 3000 Å thick over the gate electrode 3 by thermal oxidation and etched back by reactive ion etching (RIE) and HF wet etching to form side walls 4 of SiO$_2$ on opposite sides of the gate electrode 3 and to form a SiO$_2$ film 6 of about 200 Å thick by retaining the SiO$_2$ film 6 over the entire surface of the silicon substrate.

Ions of a n-type impurity such as As or the like are implanted in a dose of $5 \times 10^{15}$ ions/cm$^2$ at 80 keV into a heavily-doped source/drain formation region through the SiO$_2$ film 6 with use of the gate electrode 3 and side walls 4 as a mask to form a heavily-doped source/drain region 5, as shown in FIG. 1(a).

The substrate thus treated is then subjected to a first heat treatment at, for example, 800° C. for about an hour to diffuse the implanted ions of the heavily-doped source/drain region 5.

Subsequently, the SiO$_2$ film 6 retained on the substrate 1 and the gate electrode 3 is removed by RIE.

Then, the substrate thus treated is subjected to a second heat treatment using RTA into which ammonia gas is introduced at a flow rate of 5 liter/min. This heat treatment is conducted at, for example, 1000° C. for about 30 sec.

EXAMPLE 2

Example 2 is effected in the same manner as in Example 1 except that the second heat treatment is conducted in an oxygen gas atmosphere at 900° C. for about 10 minutes using a typical annealer instead of RTA, to which typical annealer oxygen gas is introduced at a flow rate of 30 liter/min.

In the semiconductor devices fabricated according to Examples 1 and 2, crystalline defects 7 such as extrinsic-type stacking faults and the like are produced in the silicon substrate 1 upon ion implantation through the SiO$_2$ film 6, and such defects are, however, eliminated by the second heat treatment in an ammonia or oxygen gas atmosphere at a high temperature for a short time. This is because the second heat treatment in an ammonia or oxygen gas atmosphere causes holes to be forcedly introduced into the silicon substrate 1 and such holes serve to rectify or eliminate the defects, thereby obtaining a uniform crystalline face.

Accordingly the present invention makes it possible to reduce leakage current and hence leads to a higher production yield.

While only certain preferred embodiments have been described in detail, as will be apparent with those familiar with the art, certain changes and modifications can be made without departing from the scope of the invention as defined by the following claims.

What we claim is:

1. A process for manufacturing a semiconductor device, comprising the steps of:
   forming a gate oxide film over the entire surface of a semiconductor substrate;
   forming a gate electrode on the gate oxide film;
   forming an oxide film over the entire surface of the semiconductor substrate including the gate electrode;
   using at least the gate electrode as a mask for implanting an impurity through the oxide film into a source/drain region;
   subjecting the substrate to a first heat treatment;
   removing the oxide film existing above the source/drain region; and
   subjecting the substrate to a second heat treatment in an ammonia or oxygen gas atmosphere.

2. A process as set forth in claim 1, wherein said impurity is arsenic ion.

3. A process as set forth in claim 1, wherein said first heat treatment is conducted at about 750°–850° C. for about 30–60 minutes.

4. A process as set forth in claim 1, wherein the removal of said oxide film is conducted by a reactive ion etching.

5. A process as set forth in claim 1, wherein said oxide film existing over the source/drain region has a thickness of about 100–400 Å.

6. A process as set forth in claim 1, wherein said second heat treatment is conducted in a Rapid Thermal Annealer at about 1000°–1100° C. for about 10–60 seconds in an ammonia gas atmosphere into which ammonia gas is introduced at a flow rate of about 3 to 6 liter/min.

7. A process as set forth in claim 1, wherein said second heat treatment is conducted at about 800°–900° C. for about 10–30 minutes in an oxygen gas atmosphere into which oxygen gas is introduced at a flow rate of about 30–40 liter/min.

* * * * *